United States Patent
Chung et al.

(10) Patent No.: US 9,348,792 B2
(45) Date of Patent: May 24, 2016

(54) COARSE-GRAINED RECONFIGURABLE PROCESSOR AND CODE DECOMPRESSION METHOD THEREOF

(71) Applicant: SAMSUNG ELECTRONICS CO., LTD., Suwon-si (KR)

(72) Inventors: Moo-Kyoung Chung, Hwaseong-si (KR); Yeon-Gon Cho, Hwaseong-si (KR); Soo-Jung Ryu, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 19 days.

(21) Appl. No.: 13/892,603

(22) Filed: May 13, 2013

(65) Prior Publication Data

US 2013/0326190 A1  Dec. 5, 2013

Related U.S. Application Data

(60) Provisional application No. 61/645,864, filed on May 11, 2012.

(51) Int. Cl.
*G06F 15/78* (2006.01)
*H03M 7/30* (2006.01)

(52) U.S. Cl.
CPC ............ *G06F 15/7867* (2013.01); *H03M 7/30* (2013.01); *Y02B 60/1207* (2013.01); *Y02B 60/1225* (2013.01)

(58) Field of Classification Search
CPC ............ G06F 15/7867; G06F 15/7871; G06F 9/30178; H03M 7/00; H03M 7/28; H03M 7/30
USPC .................. 326/37–50; 711/101–110; 712/15, 712/10–12
See application file for complete search history.

(56) References Cited

U.S. PATENT DOCUMENTS

| | | | | |
|---|---|---|---|---|
| 6,304,101 B1 * | 10/2001 | Nishihara | ........... | G06F 17/5054 326/40 |
| 6,366,117 B1 * | 4/2002 | Pang et al. | ...................... | 326/38 |

(Continued)

FOREIGN PATENT DOCUMENTS

| KR | 10-2005-0089031 A | 9/2005 |
|---|---|---|
| KR | 10-2008-0086739 A | 9/2008 |
| KR | 10-2011-0095049 A | 8/2011 |

OTHER PUBLICATIONS

Jafri et al., Compression Based Efficient and Agile Configuration Mechanism for Coarse Grained Reconfigurable Architectures, 2011 IEEE International Parallel & Distributed Processing Symposium.*

(Continued)

*Primary Examiner* — Alexander H Taningco
*Assistant Examiner* — Nelson Correa
(74) *Attorney, Agent, or Firm* — Sughrue Mion, PLLC (57) ABSTRACT

A coarse-grained reconfigurable processor having an improved code compression rate and a code decompression method thereof are provided to reduce a capacity of a configuration memory and reduce power consumption in a processor chip. The coarse-grained reconfigurable processor includes a configuration memory configured to store reconfiguration information including a header storing a compression mode indicator and a compressed code for each of a plurality of units and a body storing at least one uncompressed code, a decompressor configured to specify a code corresponding to each of the plurality of units among the at least one uncompressed code within the body based on the compression mode indicator and the compressed code within the header, and a reconfigurator including a plurality of PEs and configured to reconfigure data paths of the plurality of PEs based on the code corresponding to each unit.

10 Claims, 9 Drawing Sheets

(56) References Cited

U.S. PATENT DOCUMENTS

| | | | |
|---|---|---|---|
| 6,915,413 B2* | 7/2005 | Yamada | G06F 9/30178 707/999.101 |
| 7,051,189 B2* | 5/2006 | Warnes | G06F 9/30145 712/210 |
| 7,124,279 B2 | 10/2006 | Topham | |
| 8,493,089 B2* | 7/2013 | Cordero | H03K 19/17796 326/101 |
| 8,990,474 B2* | 3/2015 | Ball | H03K 19/1776 711/102 |
| 2004/0139298 A1 | 7/2004 | Holloway et al. | |
| 2008/0235492 A1 | 9/2008 | Baek et al. | |
| 2011/0202749 A1 | 8/2011 | Jin et al. | |
| 2012/0079503 A1 | 3/2012 | Dally et al. | |
| 2013/0227255 A1* | 8/2013 | Kim | 712/229 |

OTHER PUBLICATIONS

Rogers, Timothy G. et al., "Cache-Conscious Wavefront Scheduling", MICRO '12 Proceedings of the 2012 45th Annual IEEE/ACM International Symposium on Microarchitecture, Dec. 2012, pp. 1-12.

Narasiman, Veynu et al., "Improving GPU Performance via Large Warps and Two-Level Warp Scheduling", MICRO-44 '11, Proceedings of the 44th Annual IEEE/ACM International Symposium on Microarchitecture, Porto Alegre, Brazil, Dec. 2011, pp. 308-317.

* cited by examiner

COARSE-GRAINED RECONFIGURABLE PROCESSOR AND CODE DECOMPRESSION METHOD THEREOF

CROSS-REFERENCE TO RELATED APPLICATION

This application claims the benefit under U.S. Provisional Patent Application No. 61/645,864, filed on May 11, 2013, the entire disclosure of which is incorporated herein by reference for all purposes.

BACKGROUND

1. Field

The following description relates to a coarse-grained reconfigurable processor and a code decompression method thereof, and more particularly, to a coarse-grained reconfigurable processor having an improved code compression rate and a code decompression method thereof.

2. Description of the Related Art

Code compression of a processor is advantageous in that a memory capacity and power consumption may be reduced in a processor chip.

The code compression is roughly divided into a statistical scheme and a dictionary scheme.

The statistical scheme is a scheme of assigning a short codeword to a frequently used code. The statistical scheme is advantageous in that a high compression rate is provided for a code of which a use frequency is high, but is disadvantageous in that parallel decompression is difficult.

The dictionary scheme uses an index of a dictionary as a codeword after the dictionary storing a plurality of codes within a memory of a processor is prepared. The dictionary scheme is advantageous in that random access and parallel decompression are easy because a length of the codeword may be fixed. However, there is a disadvantage in that compression efficiency is low when a size of the dictionary increases due to an increasing number of stored codes and a complex overflow should be processed to use a code unregistered in the dictionary when a size of the dictionary is reduced.

On the other hand, a coarse-grained reconfigurable processor (coarse-grained reconfigurable array (CGRA)) is hardware having an array of a plurality of function units (FUs) capable of rapidly processing a large-scale function.

Because the degradation of performance is serious when the coarse-grained reconfigurable processor does not fetch a code for every cycle, a code is generally stored in a near on-chip memory, that is, a configuration memory. However, because the number of FUs is large in the coarse-grained reconfigurable processor, a code length necessary to process a function is also very long.

Accordingly, there is a problem in that the on-chip memory excessively occupies an area on a coarse-grained reconfigurable processor chip and excessively consumes power when appropriate code compression is not performed.

SUMMARY

In one general aspect, there is provided a coarse-grained reconfigurable processor comprising: a configuration memory configured to store reconfiguration information comprising a header storing a compression mode indicator and a compressed code for each of a plurality of units and a body storing at least one uncompressed code; a decompressor configured to specify a code corresponding to each of the plurality of units among the at least one uncompressed code within the body based on the compression mode indicator and the compressed code within the header; and a reconfigurator comprising a plurality of processing elements (PEs) and configured to reconfigure data paths of the plurality of PEs based on the code corresponding to each unit.

In another general aspect, there is provided a coarse-grained reconfigurable processor comprising: for each of two or more code groups comprising some of a plurality of codes comprised in reconfiguration information, a configuration memory configured to store reconfiguration information comprising a header storing compression mode information of the code group and compressed code information for each of the plurality of codes within the code group and a body storing at least one uncompressed code; a decompressor configured to specify a code corresponding to each of the plurality of units based on the compression mode information and the compressed code information for each of the two or more code groups; and a reconfigurator comprising a plurality of PEs and configured to reconfigure data paths of the plurality of PEs based on the code corresponding to each unit.

In still another general aspect, there is provided a code decompression method of a coarse-grained reconfigurable processor, comprising: specifying a code corresponding to each of a plurality of units among a plurality of codes stored in a body of reconfiguration information based on a compression mode indicator and a compressed code for each of the plurality of units within a header of the reconfiguration information stored in a configuration memory of the coarse-grained reconfigurable processor; and reconfiguring data paths of a plurality of PEs based on the code corresponding to each unit.

Other features and aspects will be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Hereinafter, specific examples for practicing the present invention will be described in detail with reference to the accompanying drawings.

A coarse-grained reconfigurable processor processes a function kernel at a high speed. The kernel refers to a set of codes for performing a specific function by processing a large amount of data through a plurality of functions, and is generally represented through a loop function in a programming language.

One configuration memory may have a plurality of kernels. A large amount of data may be processed by iterative execution of each kernel.

On the other hand, the configuration memory has a code for controlling an FU, a local register (LR), and a multiplexer (MUX) within the coarse-grained reconfigurable processor. Large-scale functions may be simultaneously performed when a plurality of FUs, a plurality of LRs, and a plurality of MUXs are used. However, in this case, a size of the configuration memory should be increased because a size of a code for controlling the FUs, the LRs, and the MUXs is also increased.

Figure 1A:
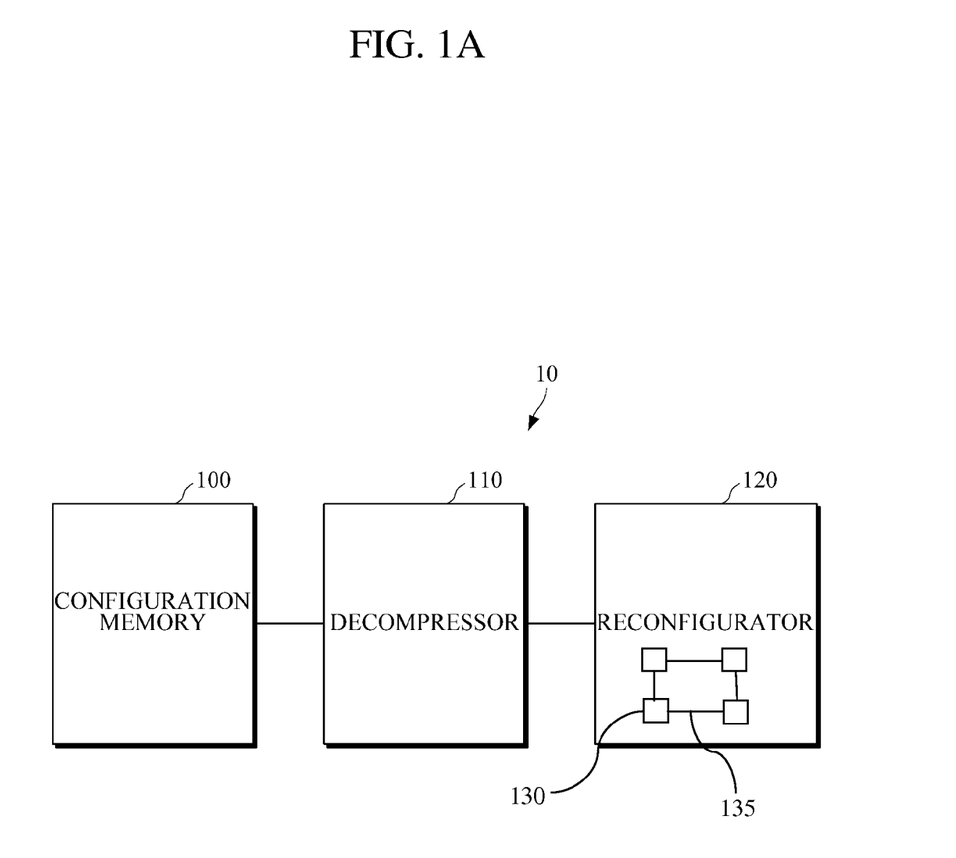
FIG. 1A is a block diagram illustrating an example of a structure of a coarse-grained reconfigurable processor and FIG. 1B is a diagram illustrating an example of components included in a processing element.
Figure 1B:
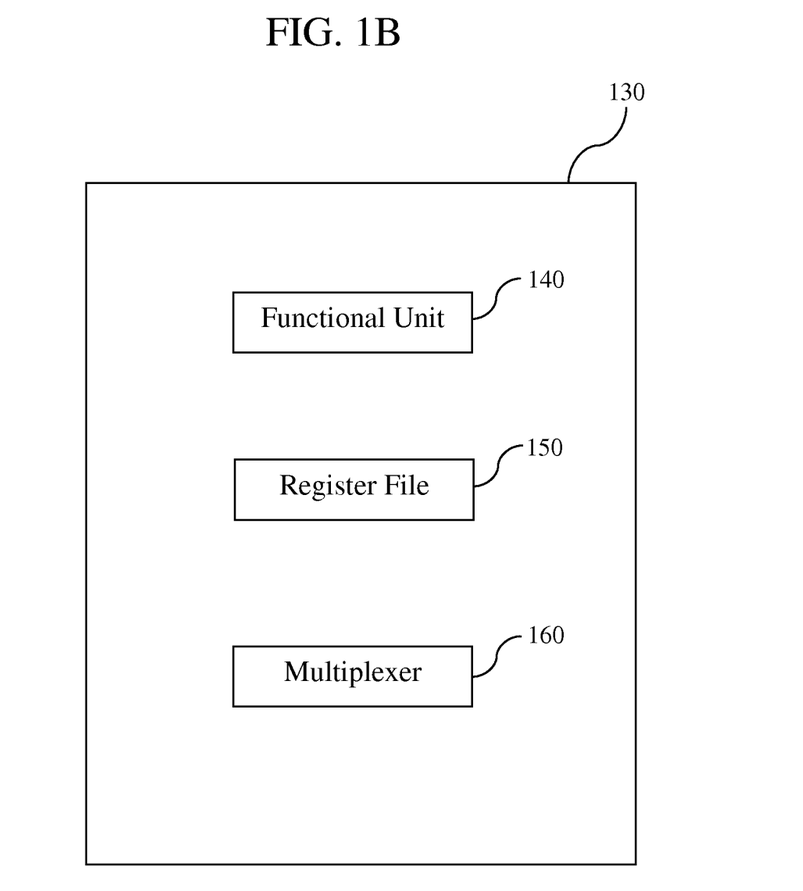

FIG. 1A is a block diagram illustrating an example of a structure of a coarse-grained reconfigurable processor and FIG. 1B is a diagram illustrating an example of components included in a processing element.

As illustrated in FIG. 1A, the coarse-grained reconfigurable processor 10 includes a configuration memory 100, a decompressor 110, and a reconfigurator 120. Also, the reconfigurator 120 includes a plurality of processing elements 130.

The configuration memory 100 stores reconfiguration information (coarse-grained reconfigurable architecture codes) generated by a compiler (not illustrated) outside the coarse-grained reconfigurable processor 10. The reconfiguration information is information for reconfiguring data paths 135 of a plurality of PEs 130 included in the reconfigurator 120. At this time, the reconfiguration information generated by the compiler is based on the following scheme.

The decompressor 110 decompresses the compressed reconfiguration information stored in the configuration memory 100, and transfers the decompressed reconfiguration information to the reconfigurator 120.

On the other hand, in order to decompress the compressed reconfiguration information, the decompressor 110 may include at least one of a kernel dictionary storage (not illustrated) configured to store a kernel dictionary, a unit dictionary storage (not illustrated) configured to store a unit dictionary, and a global dictionary storage (not illustrated) configured to store a global dictionary.

Hereinafter, the kernel dictionary, the unit dictionary, and the global dictionary will be described in detail.

The reconfigurator 120 includes a plurality of PEs 130, and reconfigures data paths of the PEs 130 based on the reconfiguration information decompressed by the decompressor 110.

At this time, each PE 130 may include an FU 140, a register file (RF) 150, and a MUX 160. The FU 140, the RF 150, and the MUX 160 are targets in which a code is executed, and are collectively referred to as "units." That is, the "unit" is a concept including all of the FU 140, the RF 150, and the MUX 160.

Figure 2A:
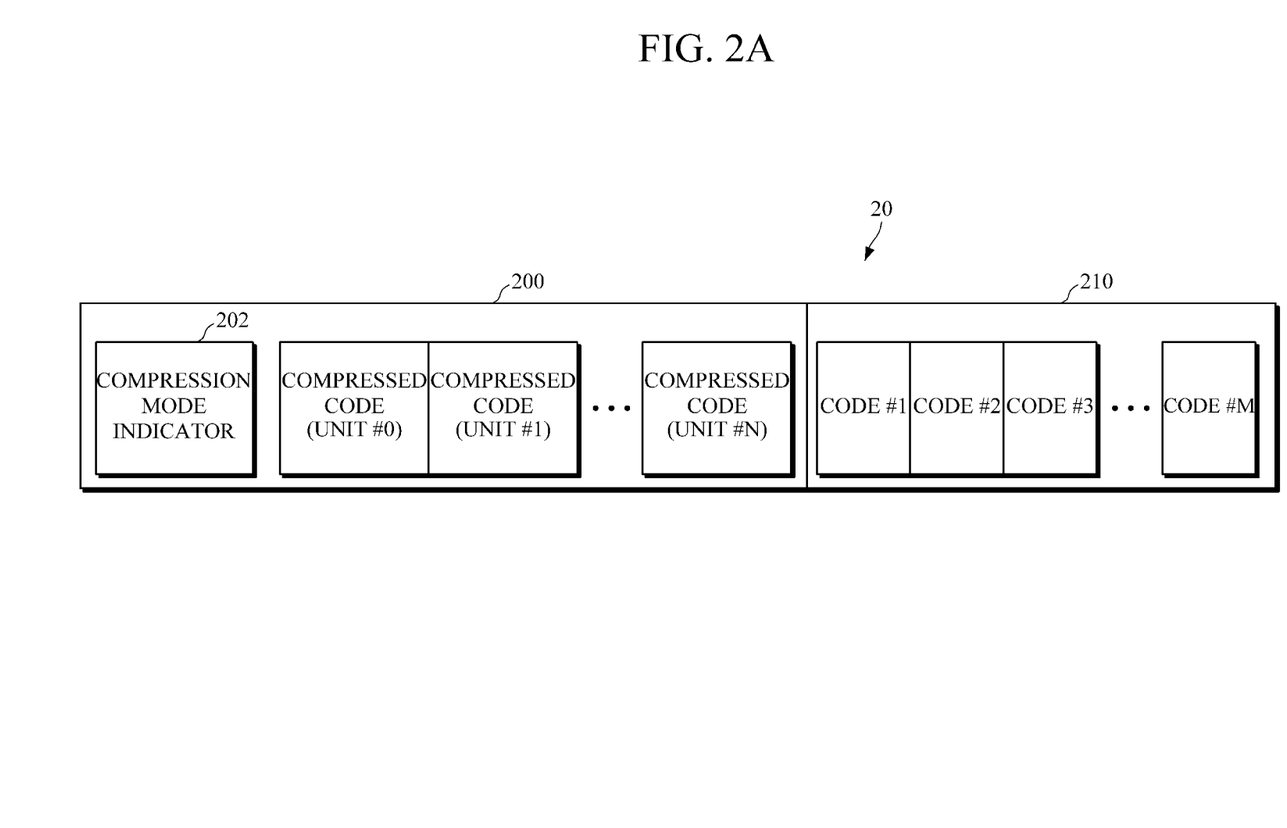
FIG. 2A is a diagram illustrating an example of a format of compressed reconfiguration information stored in a configuration memory of FIG. 1A.

FIG. 2A is a diagram illustrating an example of a format of compressed reconfiguration information stored in a configuration memory of FIG. 1.

As illustrated in FIG. 2A, the compressed reconfiguration information 20 includes a header 200 and a body 210.

At this time, the header 200 includes a compression mode indicator 202 and a compressed code for each and every unit included in a reconfigurator 120. In addition, the body 210 includes an uncompressed code corresponding to the compressed code.

Table 1 shows an example of a 4-bit compression mode indicator and contents of a compressed code.

TABLE 1

| Compression mode indicator | Compression mode indicator symbol | Contents of supported compression mode | Bit width of compressed code | Contents of compressed code | |
|---|---|---|---|---|---|
| 0000 | NOE | No encoding | 0 | | Uncompressed |
| 0001 | NOP | NOP encoding | 1 | 0 | Uncompressed |
| | | | | 1 | NOP |
| 0010 | NSK | No encoding | 2 | 00 | Uncompressed |
| | | | | 01 | NOP |
| | | | | 10 | Keep |
| | | | | 11 | Same |
| 0011 | NGK | NOP encoding | 2 | 00 | Uncompressed |
| | | | | 01 | NOP |
| | | | | 10 | Global dictionary |
| | | | | 11 | Kernel dictionary |
| 0100 | NG2 | NOP, same, keep encoding | 2 | 00 | Uncompressed |
| | | | | 01 | NOP |
| | | | | 10 | Global dictionary 0 |
| | | | | 11 | Global dictionary 1 |
| 0101 | NL2 | NOP, L-Dic2 encoding | 2 | 00 | Uncompressed |
| | | | | 01 | NOP |
| | | | | 10 | Kernel Dictionary 0 |
| | | | | 11 | Kernel Dictionary 1 |
| 0110 | NGL | NOP, G-Dic, L-Dic encoding | 2 | 00 | Uncompressed |
| | | | | 01 | NOP |
| | | | | 10 | Kernel dictionary |
| | | | | 11 | Global dictionary |
| 0111 | NGU | NOP, G-Dic, | 2 | 00 | Uncompressed |

TABLE 1-continued

| Compression mode indicator | Compression mode indicator symbol | Contents of supported compression mode | Bit width of compressed code | Contents of compressed code | |
|---|---|---|---|---|---|
| | | U-Dic encoding | | 01 | NOP |
| | | | | 10 | Global dictionary |
| | | | | 11 | Unit dictionary |
| 1000 | NG4SK | NOP, G-Dic4, same, keep encoding | 3 | 000 | Uncompressed |
| | | | | 001 | NOP |
| | | | | 010 | Global dictionary 0 |
| | | | | 011 | Global dictionary 1 |
| | | | | 100 | Global dictionary 2 |
| | | | | 101 | Global dictionary 3 |
| | | | | 110 | Same |
| | | | | 111 | Keep |
| . . . | . . . | . . . | 3 | . . . | . . . |
| 1111 | NG2U2SK | NOP, G-Dic2, U-Dic2, same, keep | 3 | 000 | Uncompressed |
| | | | | 001 | NOP |
| | | | | 010 | Global dictionary 0 |
| | | | | 011 | Global dictionary 1 |
| | | | | 100 | Unit dictionary 0 |
| | | | | 101 | Unit dictionary 1 |
| | | | | 110 | Same |
| | | | | 111 | Keep |

As shown in Table 1, the compression mode indicator represents contents of a function used in a compression scheme.

For example, NOE denotes no encoding. That is, this means that the code is uncompressed. In this case, because a separate compressed code is unnecessary, a code is compressed in a bit width of 0.

In addition, NOP denotes no-operation encoding. In this case, a code is compressed in one bit. Two codes such as "uncompressed" and "NOP encoding" may be included. If there is a kernel mostly occupied by an NOP function, the code may be compressed as a 1-bit compressed code, so that it is possible to significantly reduce a header overhead.

When a bit width of the compressed code is increased, the number of uncompressed codes included in the body is decreased.

Figure 2B:
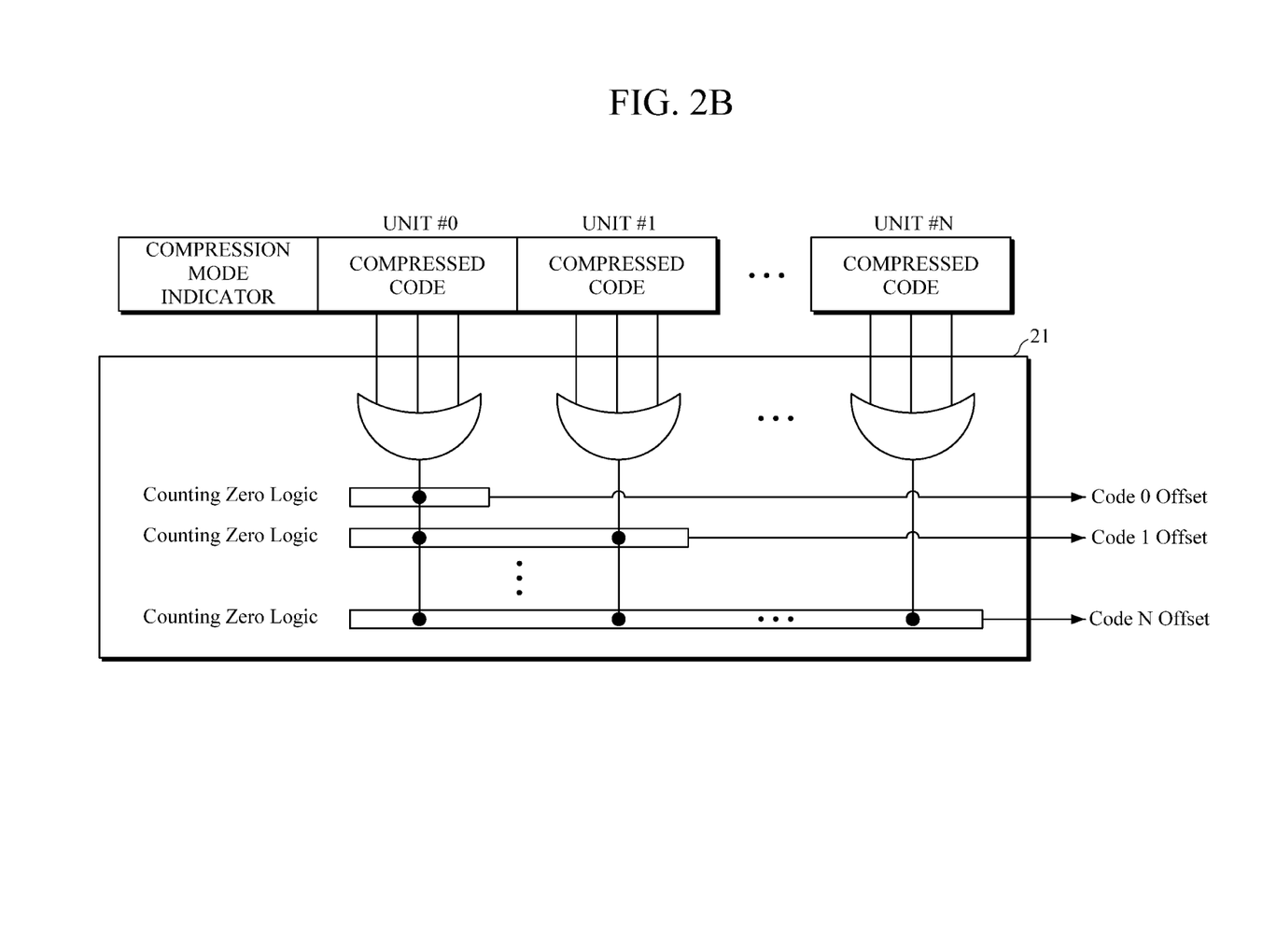
FIG. 2B is a diagram illustrating an example of a code offset determiner included in a decompressor FIG. 1A.

On the other hand, the decompressor 110 of FIG. 1A may further include a code offset determiner 21 that causes a code to correspond to each unit.

FIG. 2B is a diagram illustrating an example of the code offset determiner included in the is decompressor of FIG. 1A.

As illustrated in FIG. 2B, the code offset determiner 21 includes an OR logic for each unit, and specifies a code stored in the body corresponding to each unit after counting the number of zeros included in the compressed code.

For example, if one bit of "0" is included in the compressed code when the compression mode indicator of a unit #0 is "0001," a (uncompressed) code corresponding to a compressed code of the unit #0 means an "uncompressed" function.

As described above, the number of "zeros" is calculated by performing an OR operation on bits of each compressed code within the header, so that it is possible to determine which code within the body corresponds to a unit related to the compressed code.

A format in which reconfiguration information compressed as described above is divided into the header 200 and the body 210 has several advantages.

A compressed code has a fixed length. Accordingly, because there is no dependency between units, it is possible to simultaneously read compressed codes for all units in parallel and decompress codes for a plurality of units in parallel.

On the other hand, because the number of uncompressed codes stored in the body 210 is determined according to information of the header 200, a length of the body 210 has a variable length.

(1) a scheme of compressing reconfiguration information using a kernel dictionary according to each kernel, (2) a scheme of compressing reconfiguration information using a global dictionary, and/or (3) a scheme of dividing units into a plurality of unit groups and using a kernel dictionary and/or a global dictionary for new reconfiguration information configured for each unit group are proposed as follows.

When reconfiguration information of the coarse-grained reconfigurable processor is compressed/decompressed, the above-described schemes may be used independently or in combination.

1. Kernel-Specific Compressed Reconfiguration Information

In the compiler, the reconfiguration information (coarse-grained reconfigurable architecture codes) may be compressed in units of kernels.

When the compression is performed in units of kernels, there is an advantage in that the effect of compression is further improved as compared with an existing reconfiguration information compression scheme, and random access may be performed in a kernel boundary. This is because a basic unit of a control flow can be designated as a kernel.

Figure 3:
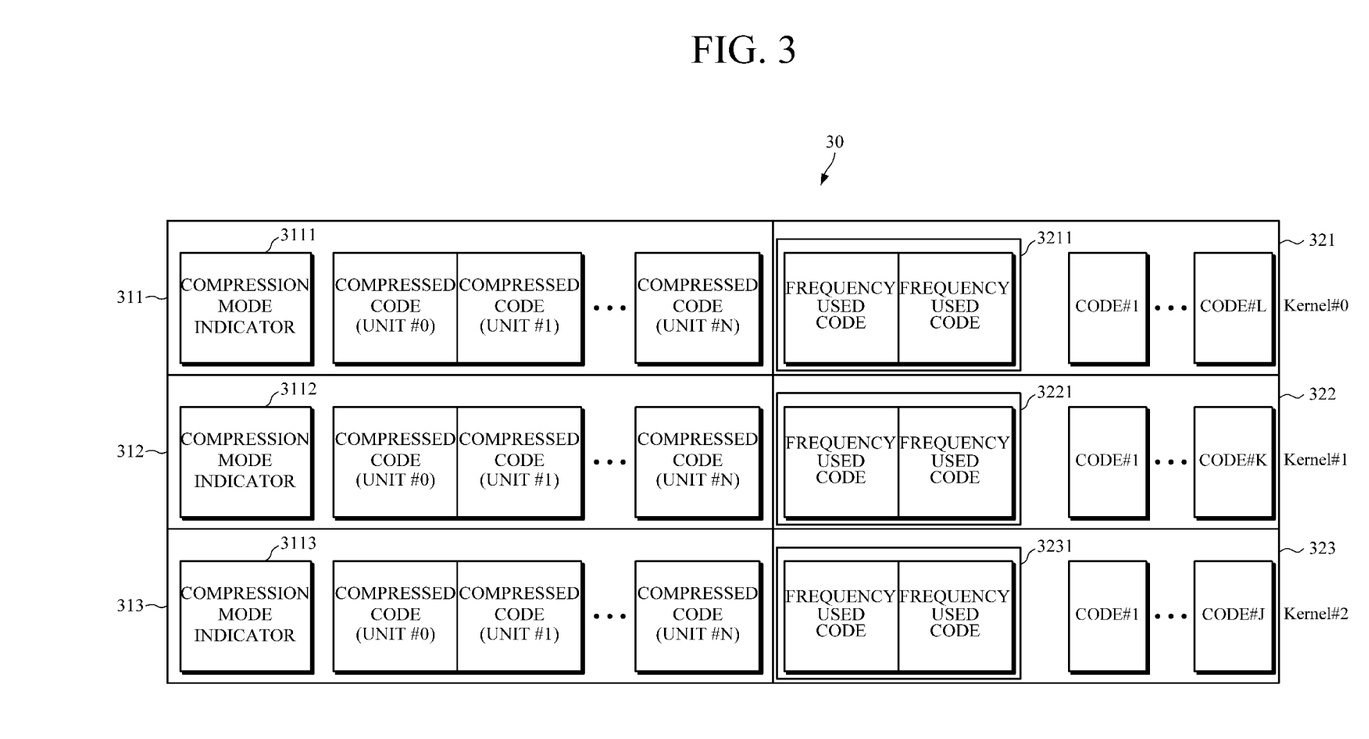
FIG. 3 is a diagram illustrating an example of a format of kernel-specific compressed reconfiguration information.

FIG. 3 is a diagram illustrating an example of a format of kernel-specific compressed reconfiguration information.

In the example of FIG. 3, three kernels included in the reconfiguration information are assumed to be a kernel #0, a kernel #1, and a kernel #2.

As illustrated in FIG. 3, reconfiguration information on kernels includes headers 311, 312, and 313 and bodies 321, 322, and 323.

In addition, the headers 311, 312, and 313 include compression mode indicators 3111, 3112, and 3113 representing compression modes and compressed codes for all individual units included in the reconfigurator 120.

In addition, the bodies 321, 322, and 323 include kernel dictionaries 3211, 3221, and 3231 and uncompressed codes.

Because different kernels generally have different code sequence characteristics, it is possible to improve a compression rate when a kernel dictionary including a kernel-specific high-frequency code is provided. The number of codes and contents of the codes included in the kernel dictionary may be differently specified according to each kernel. All codes included in the kernel dictionary are uncompressed codes.

In addition, uncompressed codes within the body not included in the kernel dictionary may also be differently specified according to each kernel.

On the other hand, in order to support kernel-specific decompression, the decompressor further includes a kernel dictionary storage configured to store a kernel-specific kernel dictionary.

Figure 4:
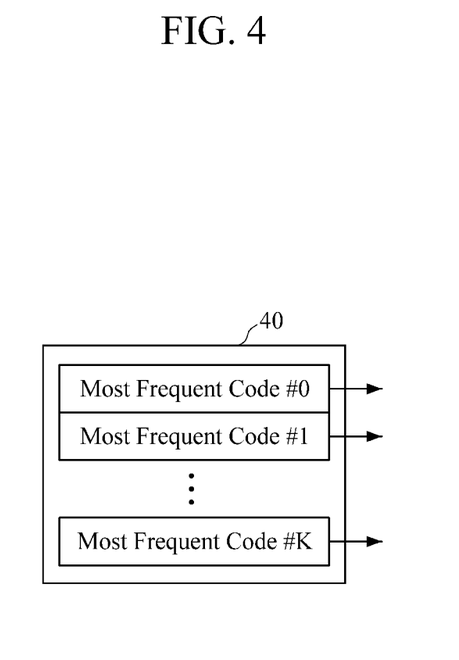
FIG. 4 is a block diagram illustrating an example of a structure of a kernel dictionary.

FIG. 4 is a block diagram illustrating an example of a structure of a kernel dictionary.

As illustrated in FIG. 4, the kernel dictionary 40 stores one or more most frequent codes. In the example of FIG. 4, (K+1) codes from a code #0 to a code #K are stored in the kernel dictionary 40. Because there is a kernel dictionary for every CGRA kernel, a plurality of units may share and use the kernel dictionary in a process of executing one kernel. Accordingly, because a plurality of read ports may be necessary, it is effective to implement the kernel dictionary in a register.

In addition, because there is a kernel dictionary for every kernel, the kernel dictionary related to the next kernel should be updated before the next kernel is performed when a current kernel ends. The compiler creates contents of the kernel dictionary to be updated, and a subject to perform the update may be the decompressor. According to an embodiment, an external processor may update the kernel processor. When the subject to perform the update is the is decompressor, the kernel dictionary 40 of FIG. 4 corresponds to the kernel dictionaries 3211, 3221, and 3231 of FIG. 3.

2. Reconfiguration Information Compressed Using Global Dictionary

Technology using a unit-specific dictionary in the related art is known. In addition, reconfiguration information using the global dictionary is proposed.

The global dictionary stores codes commonly frequently used for all units. When the global dictionary is used, redundancy occurring among a plurality of unit dictionaries can be reduced.

Figure 5:
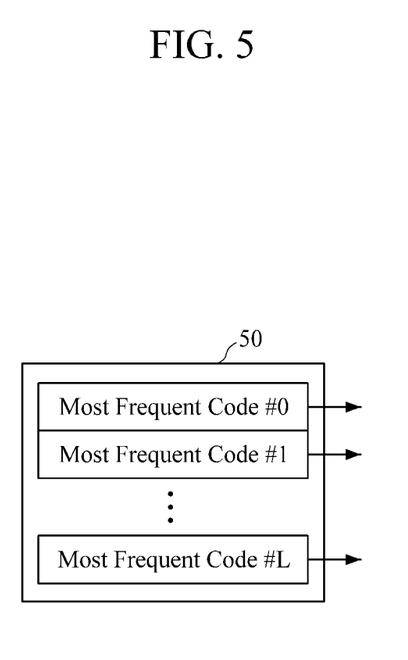
FIG. 5 is a block diagram illustrating an example of a structure of a global dictionary.

FIG. 5 is a block diagram illustrating an example of a structure of the global dictionary. In the example of FIG. 5, (L+1) codes from a code #0 to a code #L are stored in the global dictionary 50.

Contents of the global dictionary 50 may be referred to by a plurality of units, and access to a plurality of entries is possible. Accordingly, the global dictionary 50 may be implemented to be implemented in a register.

Figure 6:
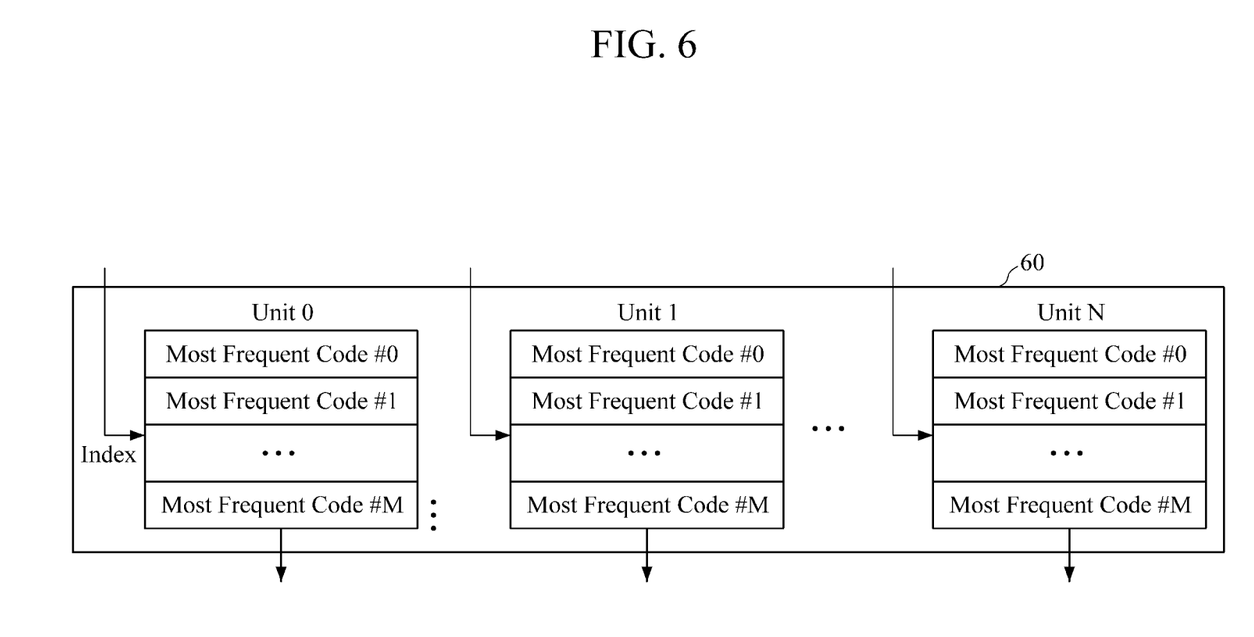
FIG. 6 is a block diagram illustrating an example of a structure of a unit dictionary.

On the other hand, FIG. 6 is a block diagram illustrating an example of a structure of a unit dictionary.

Because the unit dictionary 60 is used according to each unit, only one read port need be present. Accordingly, the unit dictionary may be implemented in the register. On the other hand, when a size of the dictionary is increased, the dictionary may be implemented in a memory.

3. Scheme of Dividing Codes into Plurality of Code Groups and Configuring New Reconfiguration Information for Every Code Group Codes used in one unit may be classified as a given group according to a role thereof. For example, an FU-related code may be classified by an operation code (opcode) and a plurality of operands (that is, MUX selection). In addition, an RF-related code may be classified by an index of an RF and an operand.

Codes having similar characteristics may form a new group. For example, it is possible to configure one code by combining a first operand of FU 0, a first operand of FU 1, a first operand of FU 2, and a first operand of FU 3.

It is possible to consider a scheme of generating a code group according to common characteristics of codes and performing compression and decompression in units of code groups as described above.

Advantageously, codes within a group exhibit similar characteristics in terms of a compression rate and the like because the codes having the similar characteristics belong to the same group. When a "compression mode" as will be described later is used, higher compression efficiency may be obtained by applying different "compression modes" to different code groups.

Figure 7:
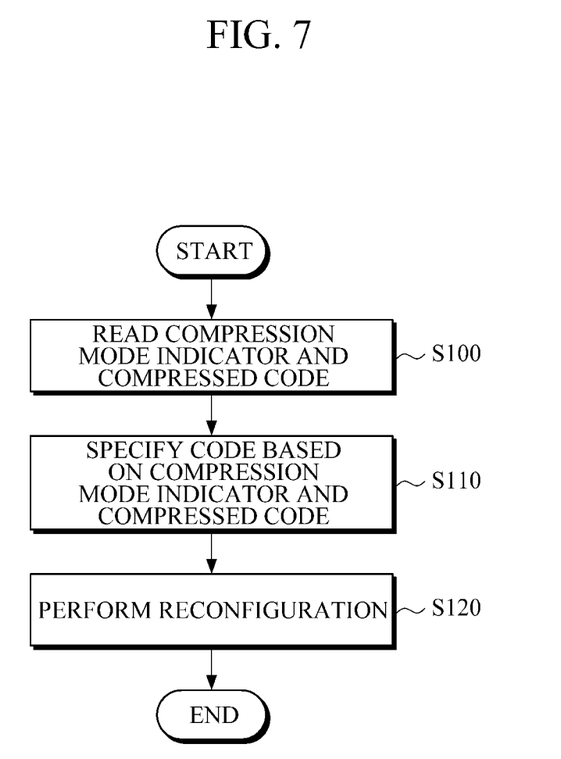
FIG. 7 is a flowchart illustrating an example of a code decompression method of the coarse-grained reconfigurable processor.

FIG. 7 is a flowchart illustrating an example of a code decompression method of the coarse-grained reconfigurable processor.

First, the decompressor reads a compression mode indicator and a compressed code for each unit within a header of reconfiguration information stored in the configuration memory of the coarse-grained reconfigurable processor (S100).

Next, the code decompressor of the coarse-grained reconfigurable processor specifies a code corresponding to a unit among a plurality of codes stored in a body of reconfiguration information based on the compression mode indicator and the compressed code for each unit (S110).

At this time, the correspondence relation table as shown in the above Table 1 may be utilized.

When a code corresponding to each unit is specified, data paths for a plurality of PEs within the reconfigurator are reconfigured based on specified codes (S120).

On the other hand, when the compression mode indicator indicates the use of a kernel dictionary in the code specifying operation S110, at least one (uncompressed) code within the kernel dictionary may correspond to at least some units among a plurality of units.

In addition, when the compression mode indicator indicates the use of a global dictionary in the code specifying operation S110, at least one (uncompressed) code within the global dictionary may correspond to at least some units among a plurality of units.

Further, when the compression mode indicator indicates the use of a unit dictionary in the code specifying operation S110, at least one (uncompressed) code within the unit dictionary may correspond to at least some units among a plurality of units.

The present invention can be implemented as computer readable codes in a computer readable record medium. The computer readable record medium includes all types of record media in which computer readable data is stored. Examples of the computer readable record medium include a ROM, a RAM, a CD-ROM, a magnetic tape, a floppy disk, and an optical data storage. Further, the record medium may be implemented in the form of a carrier wave such as Internet transmission. In addition, the computer readable record medium may be distributed to computer systems over a network, in which computer readable codes may be stored and executed in a distributed manner.

A number of examples have been described above. Nevertheless, it will be understood that various modifications may be made. For example, suitable results may be achieved if the described techniques are performed in a different order and/or if components in a described is system, architecture, device, or circuit are combined in a different manner and/or replaced or supplemented by other components or their equivalents. Accordingly, other implementations are within the scope of the following claims.

What is claimed is:

1. A coarse-grained reconfigurable processor comprising:
a configuration memory configured to store reconfiguration information comprising a header including a compression mode indicator and a compressed code for each of a plurality of units corresponding to a functional unit, a register file, and a multiplexer that are included in each of a plurality of processing elements (PEs), and a body storing uncompressed codes;
a decompressor configured to identify an uncompressed code in the body of the reconfiguration information corresponding to each of the plurality of units based on the compression mode indicator and the compressed code within the header of the reconfiguration information; and
a reconfigurator comprising the plurality of PEs and configured to reconfigure data paths of the plurality of PEs based on the uncompressed code corresponding to each unit,
wherein the compression mode indicator represents contents of a function used in a compression scheme, and
wherein the decompressor comprises a code offset determiner configured to determine a number of zeros comprised in the compressed code for each unit to determine which of the uncompressed code stored in the body corresponds to each respective unit based on the determined number of zeros.

2. The coarse-grained reconfigurable processor of claim 1, wherein the reconfiguration information further comprises:
a kernel dictionary comprising at least one code used in a kernel for each of a plurality of kernels of the reconfiguration information in the body, where each kernel comprises a set of codes for performing a specific function.

3. The coarse-grained reconfigurable processor of claim 2, wherein the decompressor comprises:
a kernel dictionary storage configured to store the kernel dictionary.

4. The coarse-grained reconfigurable processor of claim 3, wherein the decompressor further comprises:
a global dictionary storage configured to store a global dictionary comprising at least one code used commonly among the plurality of units.

5. The coarse-grained reconfigurable processor of claim 4, wherein the global dictionary is provided from outside the coarse-grained reconfigurable processor to the coarse-grained reconfigurable processor.

6. The coarse-grained reconfigurable processor of claim 1, wherein the decompressor comprises:
a global dictionary storage configured to store a global dictionary comprising at least one code used commonly among the plurality of units.

7. A coarse-grained reconfigurable processor comprising:
for each of two or more code groups comprising a plurality of codes included in reconfiguration information,
a configuration memory configured to store reconfiguration information comprising a header including compression mode information of the code group and compressed code information for each of the plurality of codes within the code group and a body storing uncompressed codes;
a decompressor configured to identify uncompressed codes corresponding to each code group based on the compression mode information and the compressed code information for each of the two or more code groups; and
a reconfigurator comprising a plurality of processing elements (PEs) and configured to reconfigure data paths of the plurality of PEs based on the uncompressed code corresponding to each code group,
wherein each code group correspond to one of a functional unit, a register file, and a multiplexer of a processing element,
wherein the compression mode information represents contents of a function used in a compression scheme, and
wherein the decompressor comprises a code offset determiner configured to determine a number of zeros comprised in the compressed code information for each code group to determine which of the uncompressed code stored in the body corresponds to each respective code group based on the determined number of zeros.

8. A code decompression method of a coarse-grained reconfigurable processor, the method comprising:
storing reconfiguration information comprising a header including a compression mode indicator and a compressed code for each of a plurality of units corresponding to a functional unit, a register file, and a multiplexer that are included in each of a plurality of processing elements (PEs) of the coarse-grained reconfigurable processor, and a body storing uncompressed codes;
identifying an uncompressed code in the body of the reconfiguration information corresponding to the plurality of units based on the compression mode indicator and the compressed code for each of the plurality of units within the header of the reconfiguration information stored in a configuration memory of the coarse-grained reconfigurable processor; and
reconfiguring data paths of the plurality of PEs based on the uncompressed code corresponding to each unit,
wherein the compression mode indicator represents contents of a function used in a compression scheme, and
wherein the identifying comprises:
determining a number of zeros included in the compressed code for each unit; and
determining which of the uncompressed code stored in the body corresponds to each respective unit based on the determined number of zeros.

9. The code decompression method of claim 8, wherein the identifying comprises:
in response to the compression mode indicator indicating a use of a kernel dictionary, identifying uncompressed codes corresponding to at least one unit among the plurality of units from at least one code within the kernel dictionary.

10. The code decompression method of claim 9, wherein the identifying further comprises:
in response to the compression mode indicator indicating a use of a global dictionary, identifying uncompressed codes corresponding to at least one unit among the plurality of units from at least one code within the global dictionary.

* * * * *